United States Patent
Choi

(10) Patent No.: US 8,248,878 B2
(45) Date of Patent: Aug. 21, 2012

(54) CIRCUIT FOR GENERATING REFRESH PERIOD SIGNAL AND SEMICONDUCTOR INTEGRATED CIRCUIT USING THE SAME

(75) Inventor: Won Jun Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 336 days.

(21) Appl. No.: 12/633,900

(22) Filed: Dec. 9, 2009

(65) Prior Publication Data

US 2010/0296356 A1  Nov. 25, 2010

(30) Foreign Application Priority Data

May 22, 2009  (KR) .................. 10-2009-0044814

(51) Int. Cl.
*G11C 7/00* (2006.01)
(52) U.S. Cl. ........ 365/222; 365/149; 365/150; 365/186; 365/230.06; 365/233.1
(58) Field of Classification Search .................. 365/149, 365/150, 186, 222, 230.06, 233.1
See application file for complete search history.

(56) References Cited

U.S. PATENT DOCUMENTS

| 6,108,252 A | 8/2000 | Park |
| 6,930,943 B2 | 8/2005 | Kim |
| 7,038,968 B2 | 5/2006 | Kim |
| 2005/0105352 A1 | 5/2005 | Lee |
| 2005/0228611 A1 | 10/2005 | Kim |
| 2006/0066386 A1 | 3/2006 | Hong |
| 2006/0087901 A1 | 4/2006 | Hong et al. |
| 2006/0092741 A1 | 5/2006 | Kim et al. |
| 2007/0121407 A1* | 5/2007 | Lee ............................... 365/222 |
| 2007/0171750 A1* | 7/2007 | Oh ................................ 365/222 |
| 2009/0323436 A1* | 12/2009 | Lee ........................ 365/189.07 |

FOREIGN PATENT DOCUMENTS

| JP | 02-276089 A | 11/1990 |
| JP | 2005-196952 A | 7/2005 |
| KR | 1019990003111 A | 1/1999 |
| KR | 1020070074456 A | 7/2007 |

* cited by examiner

*Primary Examiner* — Fernando N. Hidalgo
(74) *Attorney, Agent, or Firm* — Ladas & Parry LLP

(57) ABSTRACT

Circuits for generating refresh period signals and semiconductor integrated circuits using the same are presented. The refresh period signal generation circuit can include an oscillator, a pulse generation unit, and a signal controller. The oscillator is configured to generate an oscillation signal in response to a refresh duration correction signal. The pulse generation unit is configured to generate a refresh period signal in response to the oscillation signal. The signal controller configured to generate the refresh duration correction signal, which corrects an active time of a refresh duration signal, in response to the oscillation signal.

12 Claims, 5 Drawing Sheets

CIRCUIT FOR GENERATING REFRESH PERIOD SIGNAL AND SEMICONDUCTOR INTEGRATED CIRCUIT USING THE SAME

CROSS-REFERENCE TO RELATED APPLICATIONS

This U.S. non-provisional patent application claims priority under 35 U.S.C. §119 of Korean Patent Application No. 10-2009-0044814 filed on May 22, 2009, the entire contents of which are incorporated herein by reference.

BACKGROUND

This disclosure relates to semiconductor circuits, and more particularly, to a circuit for generating a refresh period signal (i.e., refresh period signal generation circuit) and a semiconductor integrated circuit using the same.

Semiconductor integrated circuits, e.g., volatile memories such as dynamic random access memories (DRAMs) are often times essentially equipped with refresh operations for retaining data stored in their memory cells.

These DRAMs are generally designed to periodically conduct the refresh operations even when in standby states for which there is no event of reading or writing operations.

In operation of DRAMs, refresh period signals are normally used for defining periods of the refresh operations.

FIG. 1 illustrates a general organization of a refresh period signal generation circuit.

As shown in FIG. 1, the general refresh period signal generation circuit 1 includes an oscillator 10, a frequency divider 20, and a pulse generation unit 30.

The oscillator 10 is shown generating an oscillation signal OSC in response to a refresh duration signal SREF that functions to determine a refresh period.

The frequency divider 20 is shown generating a plurality of frequency signals operating in 1 µs, 2 µs, 4 µs, 8 µs and 16 µs by dividing the oscillation signal OSC.

The pulse generation unit 30 is shown outputting a refresh period signal SREFP from one of the frequency signals (1 µs, 2 µs, 4 µs, 8 µs and 16 µs) which is selected in accordance with a fuse option signal FSEL.

FIG. 2 shows a waveform of an output signal generated from the period signal generation circuit of FIG. 1.

The refresh duration signal SREF is inactivated when there is an input of a refresh escape command SREX. The refresh escape command SREX is generated regardless of an operating status of the refresh period signal generation circuit. In other words, without relevance to output signals of the oscillator 10, the frequency divider 20 and the pulse generation unit 30, the refresh escape signal SREX is independently generated to inactivate the refresh duration signal SREF.

It is first assumed that the pulse generation unit 30 makes the refresh period signal SREFP from one of the plural frequency signals (1 µs, 2 µs, 4 µs, 8 µs and 16 µs), e.g., the 8 µs frequency signal.

As shown in FIG. 2, when the refresh duration signal SREF is inactivated by the refresh escape command SREX at the time when the oscillation signal OSC is generated, i.e., when the refresh duration signal SREF is inactivated by the refresh escape command SREX while the 8 µs frequency signal is generated from the oscillation signal OSC, the 8 µs frequency signal may be abnormally generated without a sufficient timing margin.

Owing to such an insufficient timing margin of the 8 µs frequency signal, the refresh period signal SREFP responding thereto is also generated in a form of glitch without a sufficient timing margin.

As the refresh operation to memory cells is carried out by selecting a row address corresponding to the memory cells in accordance with a pulse of the refresh period signal SREFP, the abnormal glitch of the refresh period signal SREFP causes the row address not to be selected.

Therefore, cell data are prone to being damaged or compromised because the memory cells corresponding to the row address that has not been yet selected are abnormally conditioned in an incomplete state of the refresh operation.

Such a timing distortion between the refresh escape command SREX and the oscillation signal OSC occurs irregularly, resulting in the glitch of the refresh period signal SREFP. For that reason, it is practically difficult to predict when the refresh period signal SREFP is generated with such an insufficient and abnormal pulse in the glitch. And it is difficult to make the glitch effect reemerged even by a test process because the refresh escape command SREX is independently applied thereto regardless of an operating status of the refresh period signal generation circuit. Simply adjusting a delay time of a signal involved therein does not bring about a adequate solution against the trouble of timing distortion between the refresh escape command SREX and the oscillation signal OSC. As a result, there would be an inadvertent defect in the memory apparatus such as DRAM.

SUMMARY OF THE INVENTION

There is provided a refresh period signal generation circuit enabling a refresh period signal stably generated, regardless of a refresh escape command, in a semiconductor integrated circuit.

In one embodiment, a refresh period signal generation circuit may include: an oscillator, a pulse generator, and a signal controller. The oscillator is configured to generate an oscillation signal in accordance with a refresh duration correction signal. The pulse generator is configured to generate a refresh period signal in accordance with the oscillation signal. The signal controller is configured to generate the refresh duration correction signal that corrects an active time of a refresh duration signal by using the oscillation signal.

In another embodiment, a semiconductor integrated circuit may include: a signal controller, a period signal generator, a refresh address counter, and a memory cell block. The signal controller is configured to generate a refresh duration correction signal that corrects an active time of a refresh duration signal by using an oscillation signal. The period signal generator is configured to generate a refresh period signal by using the oscillation signal generated in accordance with the refresh duration correction signal. The refresh address counter is configured to count and to output a refresh address in accordance with the refresh period signal. The memory cell block is configured to refresh memory cells corresponding to the refresh address.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
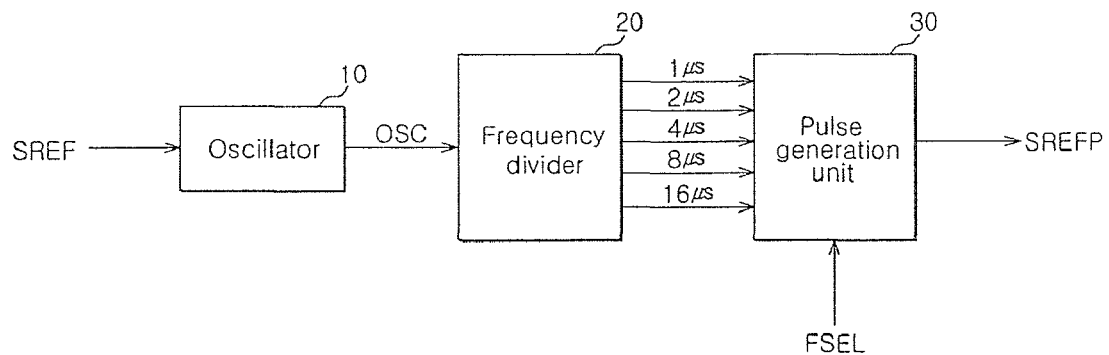
FIG. 1 is a block diagram illustrating a general organization of a refresh period signal generation circuit.
Figure 2:
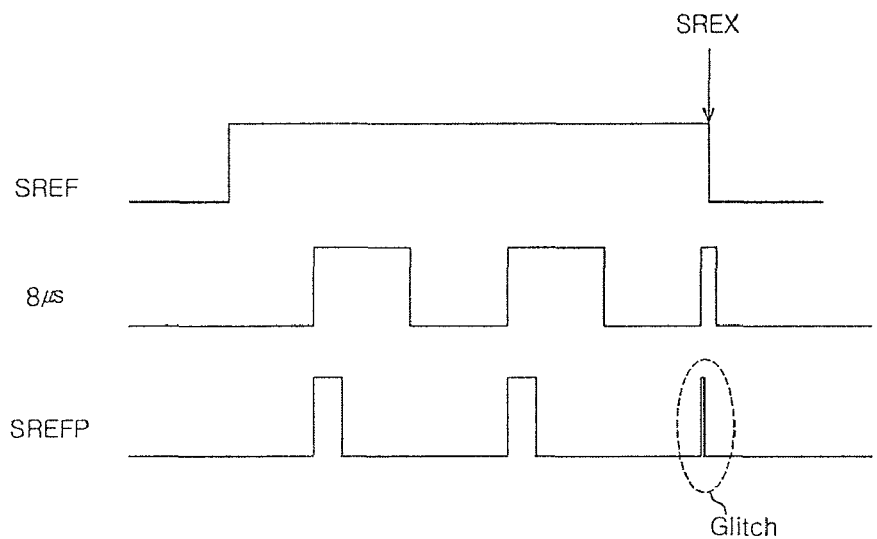
FIG. 2 is a waveform diagram showing an operation with an output signal from the refresh period signal generation circuit of FIG. 1.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

As aforementioned with relevance to the conventional case, since a timing distortion between a refresh escape command and an oscillation signal occurs irregularly, it is practically impossible to predict a time of the erroneous pulse generation (e.g., glitch) of the refresh period signal and to make the erroneous generation reemerged. Further, just adjusting a delay time of a signal could not be completely helpful in solving such a timing difficulty.

An exemplary embodiment of the present invention uses a scheme of correcting an active time of a refresh period signal by finding a generation state of an oscillation signal.

Hereinafter, it will be described about an exemplary embodiment of the present invention in conjunction with the accompanying drawings.

Figure 3:
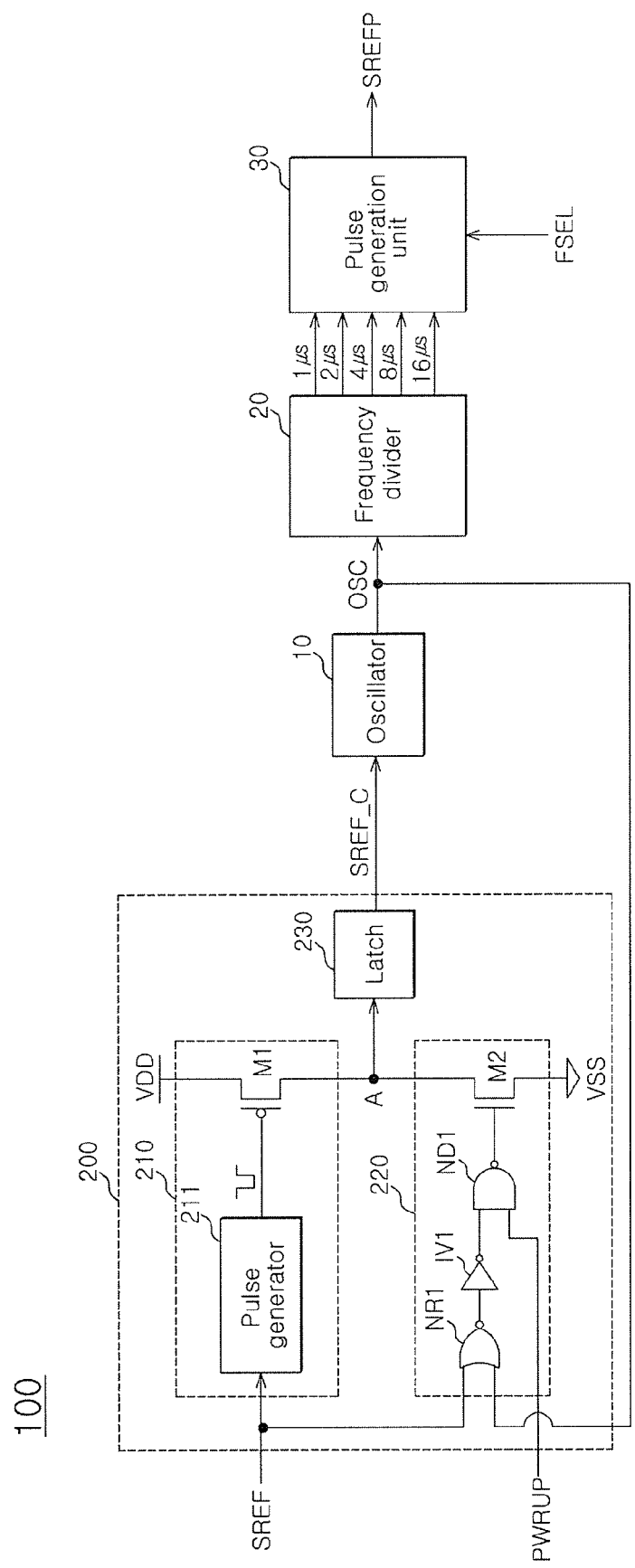
FIG. 3 is a circuit diagram illustrating a refresh period signal generation circuit in accordance with an embodiment of the present invention.

FIG. 3 illustrates a configuration of a refresh period signal generation circuit in accordance with an embodiment of the present invention.

Referring to FIG. 3, the refresh period signal generation circuit 100 according to this embodiment of the present invention is comprised of an oscillator 10, a frequency divider 20, a pulse generation unit 30, and a signal controller 200.

The oscillator 10, the frequency divider 20 and the pulse generation unit 30 can be similarly configured as shown in FIG. 1, and therefore these will not be further described.

The signal controller 200 is configured to generate a refresh duration correction signal SREF_C for correcting an active time of the refresh duration signal SREF by means of the oscillation signal OSC. The signal controller 200 includes a refresh beginning detector 210, a refresh end detector 220, and a latch 230.

The refresh beginning detector 210 is configured to detect a start point of an active time of the refresh duration correction signal SREF_C in response to activation of the refresh duration signal SREF. The refresh beginning detector 210 includes a pulse generator 211, and a first transistor M1. The pulse generator 211 of the refresh beginning detector 210 outputs a negative pulse from the refresh duration signal SREF. The first transistor M1 of the refresh beginning detector 210 applies a power source voltage VDD to a node A in response to the negative pulse.

The refresh end detector 220 is configured to detect an end point of an active time of the refresh duration correction signal SREF_C in accordance with a combination of the refresh duration signal SREF and the oscillation signal OSC supplied from the oscillator 10. The refresh end detector 220 operates to initialize the refresh duration correction signal SREF_C in accordance with a power-up signal PWRUP. The refresh end detector 220 includes a plurality of logical devices, i.e., a NOR gate NR1, an inverter IV1 and a NAND gate ND1, executing an OR operation on an input of the refresh duration signal SREF and of the oscillation signal OSC, and executing a not-AND (NAND) output operation using the result of the OR operation and using the power-up signal PWRUP, and outputting the NAND result at a gate of a second transistor M2 connecting the node A and to a ground voltage VSS.

The latch 230 is configured to hold an active level state of the refresh duration correction signal SREF_C in response to an output of the refresh beginning detector 210 and to inactivate the refresh duration correction signal SREF_C in response to an output of the refresh end detector 220.

Figure 4:
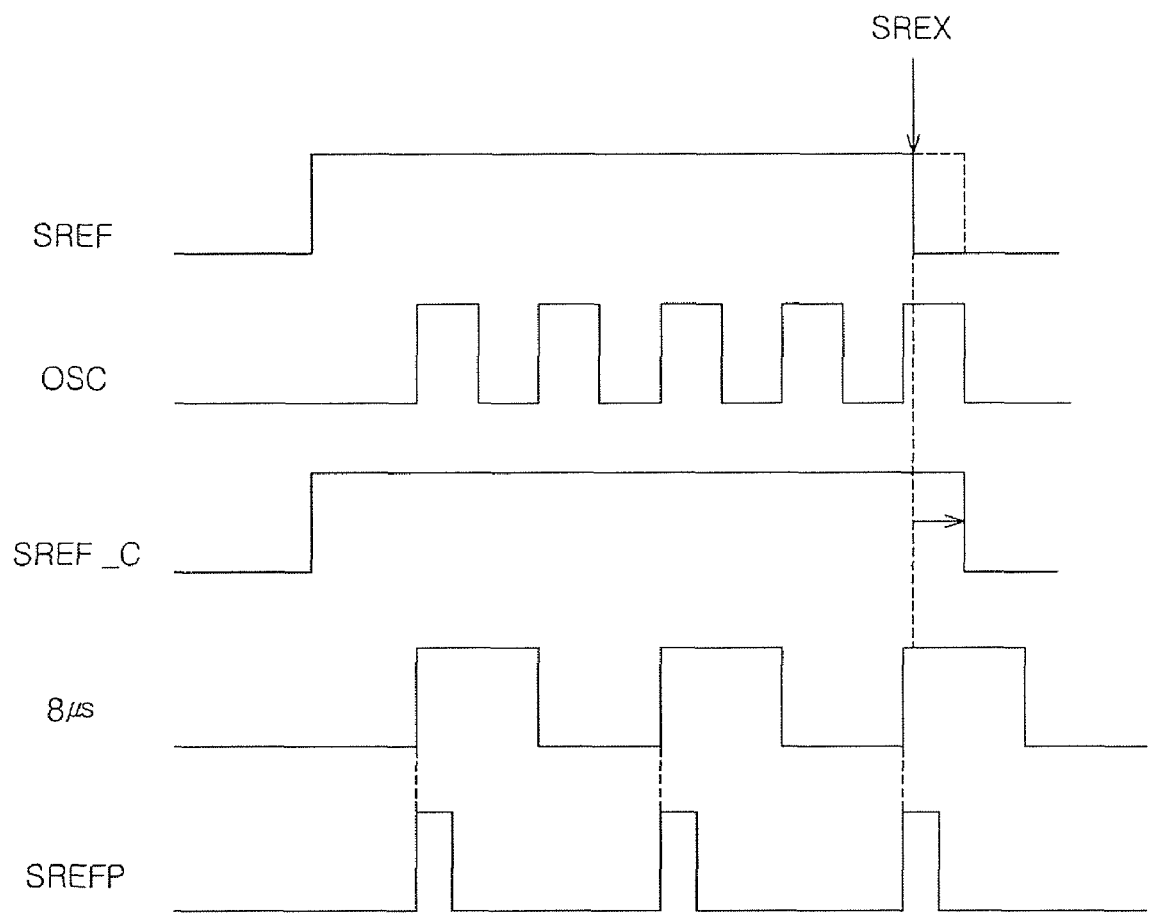
FIG. 4 is a waveform diagram showing an operation with an output signal from the refresh period signal generation circuit of FIG. 3.

FIG. 4 shows waveforms about an operation with an output signal from the refresh period signal generation circuit of FIG. 3.

Referring to FIG. 4, responding to the power-up signal PWRUP, the NAND gate ND1 of the refresh end detector 220 outputs a high level state signal and the second transistor M2 is turned on to discharge the node A to a low level state. By the low level state of the node A, the latch 230 initializes the refresh duration correction signal SREF_C. That is, the refresh duration correction signal SREF_C is set on a low level state as an initial condition.

The power-up signal PWRUP goes to a high level state from a low level state when the power source voltage VDD of the semiconductor memory is stabilized on a target level state.

Afterward, when the refresh duration signal SREF is activated to a high level state from a low level state, then the pulse generator 211 generates a negative pulse to make the first transistor M1 transition an input of the latch 230 to a high level state.

Then, the latch 230 holds the high level state input thereat. From the latch 230, the high level state signal is provided to the oscillator 10 as the refresh duration correction signal SREF_C.

The oscillator 10 generates the oscillation signal OSC in response to the refresh duration correction signal SREF_C of high level state.

The frequency divider 20 generates a plurality of frequency signals, which are operating in the cycle periods of 1 μs, 2 μs, 4 μs, 8 μs and 16 μs, by dividing the oscillation signal OSC.

The pulse generation unit 30 operates to generate the refresh period signal SREFP from one of the divided frequency signals (1 μs, 2 μs, 4 μs, 8 μs and 16 μs), e.g., the 8 μs frequency signal, which is selected by a fuse option signal FSEL.

During this, as the power-up signal PWRUP is conditioned in a high level state, the NAND gate ND1 outputs a low level state signal to maintain the node A on a high level state while the refresh duration signal SREF is being on a high level state.

Accordingly, the refresh duration correction signal SREF_C is also held on a high level state by the latch 230.

When the refresh duration signal SREF goes to a low level state by the refresh escape command SREX and the oscillation signal OSC is then set to a low level state, the NAND gate ND1 outputs a high level state signal to set the node A transition into a low level state. Then, the refresh duration correction signal SREF_C is set at a low level state by the latch 230.

Since the refresh duration correction signal SREF_C is now set at a low level state, the oscillator 10, then the frequency divider 20 and the pulse generation unit 30 stop operating and the pulse of the refresh period signal SREFP is not further generated.

In the meantime, if the oscillation signal OSC is still conditioned in a high level state, although the refresh duration signal SREF has already transitioned to a low level state by the refresh escape command SREX, i.e., if the oscillation signal OSC remains being generated, then the NAND gate ND1 outputs a low level state signal to keep the node A at a high level state. Thereby, the refresh duration correction signal SREF_C from the latch 230 is also maintained at a high level state as shown in FIG. 4.

Since the refresh duration signal SREF_C is in a high level state even though the refresh duration signal SREF has already transitioned into a low level state, then the oscillator 10 generates the oscillation signal OSC with a sufficient timing margin. Thus, the divided frequency signals of 1 µs, 2 µs, 4 µs, 8 µs and 16 µs are accordingly generated with sufficient timing margins.

Then, the pulse generation unit 30 generates the refresh period signal SREFP with a sufficient timing margin from one of the divided frequency signals of 1 µs, 2 µs, 4 µs, 8 µs and 16 µs, e.g., the 8 µs frequency signal, which have sufficient timing margins.

The refresh period signal generation circuit according to the exemplary embodiment of the present invention is featured by finding a generation state of the oscillation signal OSC and correcting an active time of the refresh period signal SREFP. It is also permissible to utilize one of the divided frequency signals of 1 µs, 2 µs, 4 µs, 8 µs and 16 µs instead of the oscillation signal OSC. In a preferred embodiment, the oscillation signal OSC can be advantageously used to correctly optimize the active time of the refresh period signal SREFP because of its earlier generation than others.

Figure 5:
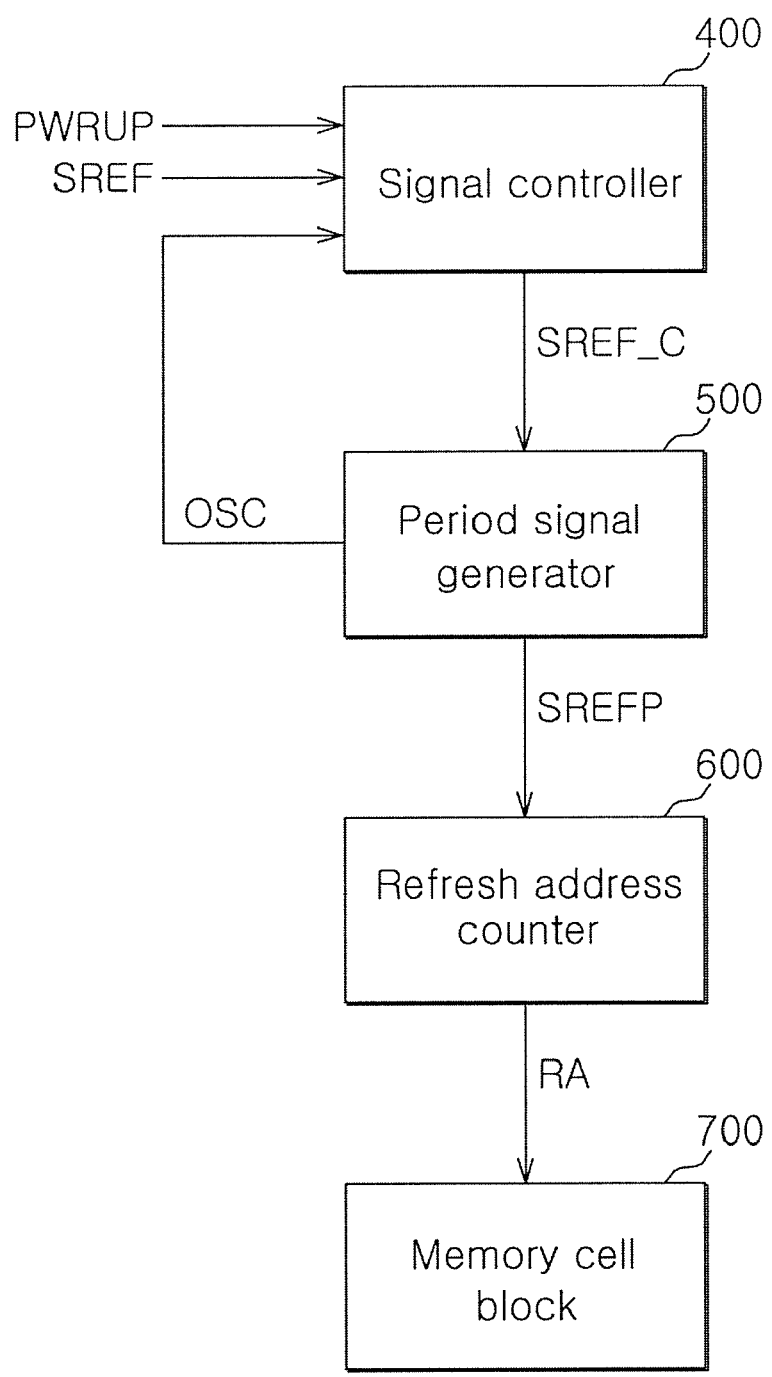
FIG. 5 is a block diagram illustrating a semiconductor integrated circuit in accordance with an embodiment of the present invention.

FIG. 5 illustrates a schematic organization of a semiconductor integrated circuit in accordance with an embodiment of the present invention.

Referring to FIG. 5, the semiconductor integrated circuit 300 is comprised of a signal controller 400, a period signal generator 500, a refresh address counter 600 and a memory cell block 700.

The signal controller 400 is configured to generate the refresh duration correction signal SREF_C for correcting an active time of the refresh duration signal SREF by means of the oscillation signal OSC.

The period signal generator 500 is configured to generate the refresh period signal SREFP from the refresh duration correction signal SREF_C.

The refresh address counter 600 is configured to count and output a row address RA in accordance with the refresh period signal SREFP.

In the memory cell block 700, a word line corresponding to the row address RA is activated to conduct the refresh operation to memory cells coupled to the word line.

Figure 6:
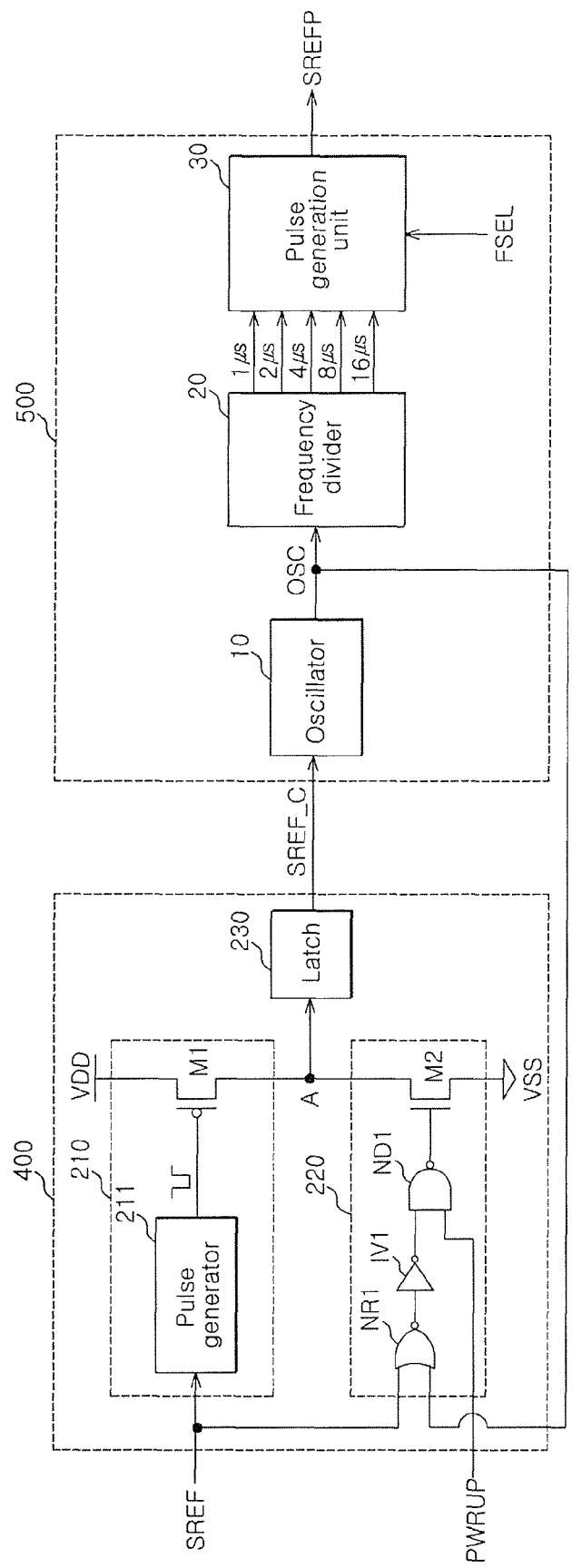
FIG. 6 is a circuit diagram exemplarily illustrating the signal controller and period signal generator shown in FIG. 5.

FIG. 6 exemplarily illustrates configurations of the signal controller 400 and the period signal generator 500 shown in FIG. 5.

The signal controller 400 may be implemented in substantially the same manner as the signal controller 200 shown in FIG. 3, so it will not be further described.

The period signal generator 500 may be comprised of the oscillator 10, the frequency divider 20 and the pulse generation unit 30. The oscillator 10, the frequency divider 20 and the pulse generation unit 30 may be implemented in substantially the same manner as those of FIG. 3, so they will not be further described.

An operation of the semiconductor integrated circuit of FIG. 5 will be now described hereinafter.

Responding to activation of the power-up signal PWRUP, the NAND gate ND1 of the refresh end detector 220 outputs a high level state signal and thereby the second transistor M2 is turned on to set the node A at a low level state. With the low level state signal at the node A, the latch 230 initializes the refresh duration correction signal SREF_C. That is, the refresh duration correction signal SREF_C is maintained on a low level state.

The power-up signal PWRUP goes to a high level state from a low level state when the power source voltage VDD of the semiconductor memory is stabilized on a target level state.

Afterward, if the refresh duration signal SREF is activated at a high level state from a low level state, the pulse generator 211 generates a negative pulse to make the first transistor M1 transition an input of the latch 230 to a high level state.

Then, the latch 230 holds the high level state input thereat. From the latch 230, the high level state signal is provided to the oscillator 10 as the refresh duration correction signal SREF_C.

The oscillator 10 generates the oscillation signal OSC in response to the refresh duration correction signal SREF_C at a high level state.

The frequency divider 20 generates a plurality of frequency signals, which are operating in the cycle periods of 1 µs, 2 µs, 4 µs, 8 µs and 16 µs, by dividing the oscillation signal OSC.

The pulse generation unit 30 operates to generate the refresh period signal SREFP from one of the divided frequency signals (1 µs, 2 µs, 4 µs, 8 µs and 16 µs), e.g., the 8 µs frequency signal, which is selected by a fuse option signal FSEL.

During this, as the power-up signal PWRUP is conditioned at a high level state, the NAND gate ND1 outputs a low level state signal to maintain the node A at a high level state while the refresh duration signal SREF is at a high level state. Accordingly, the refresh duration correction signal SREF_C is also held at a high level state by the latch 230.

When the refresh duration signal SREF goes to a low level state by the refresh escape command SREX and the oscillation signal OSC is then set to a low level state, the NAND gate ND1 outputs a high level state signal to set the node A transition into a low level state. Then, the refresh duration correction signal SREF_C goes to a low level state by the latch 230.

Since the refresh duration correction signal SREF_C is now set at a low level state, then the oscillator 10, the frequency divider 20 and the pulse generation unit 30 stop operating and the pulse of the refresh period signal SREFP is not further generated.

In the meantime, if the oscillation signal OSC is still conditioned in a high level state, although the refresh duration signal SREF has already transitioned to a low level state by the refresh escape command SREX, i.e., if the oscillation signal OSC remains being generated, then the NAND gate ND1 outputs a low level state signal to keep the node A at a high level state. Thereby, the refresh duration correction signal SREF_C from the latch 230 is also maintained at a high level state as shown in FIG. 4.

As the refresh duration correction signal SREF_C is in a high level state even though the refresh duration signal SREF has already transitioned into a low level state, then the oscillator 10 generates the oscillation signal OSC with a sufficient timing margin. Thus, the divided frequency signals of 1 μs, 2 μs, 4 μs, 8 μs and 16 μs are accordingly generated with sufficient timing margins.

Then, the pulse generation unit 30 generates the refresh period signal SREFP with a sufficient timing margin from one of the divided frequency signals of 1 μs, 2 μs, 4 μs, 8 μs and 16 μs, e.g., the 8 μs frequency signal, which have sufficient timing margins.

The refresh address counter 600 operates to count and output a row address RA in accordance with the refresh period signal SREFP.

In the memory cell block 700, a word line corresponding to the row address RA is activated to refresh memory cells coupled thereto.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A refresh period signal generation circuit, comprising:
   an oscillator configured to generate an oscillation signal in response to a refresh duration correction signal;
   a pulse generation unit configured to generate a refresh period signal in response to the oscillation signal; and
   a signal controller configured to activate the refresh duration correction signal in response to a refresh duration signal and inactivate the refresh duration correction signal in response to the oscillation signal and the refresh duration signal.

2. The refresh period signal generation circuit of claim 1, wherein the signal controller comprises:
   a refresh beginning detector configured to detect a start point of an active time of the refresh duration correction signal in response to an activation of the refresh duration signal;
   a refresh end detector configured to detect an end point of an active time of the refresh duration correction signal in response to a combination of the refresh duration signal and the oscillation signal; and
   a latch configured to activate and latch the refresh duration correction signal in response to an output of the refresh beginning detector and configured to inactivate the refresh duration correction signal in response to an output of the refresh end detector.

3. The refresh period signal generation circuit of claim 2, wherein the refresh beginning detector comprises:
   a pulse generator configured to output a pulse in response to the refresh duration signal; and
   a switching device configured to connect a power source voltage to an input of the latch in response to the pulse.

4. The refresh period signal generation circuit of claim 2, wherein the refresh end detector is configured to initialize the refresh duration correction signal in response to a power-up signal.

5. The refresh period signal generation circuit of claim 4, wherein the refresh end detector comprises:
   a first logic device configured to combine the refresh duration signal and the oscillation signal;
   a second logic device configured to combine an output of the first logic device and the power-up signal; and
   a switching device configured to connect a ground voltage to an input of the latch in response to an output of the second logic device.

6. The refresh period signal generation circuit of claim 1, further comprising a frequency divider configured to divide the oscillation signal and provide a plurality of frequency signals into the pulse generation unit.

7. A semiconductor integrated circuit, comprising:
   a signal controller configured to activate a refresh duration correction signal in response to a refresh duration signal and inactivate the refresh duration correction signal in response to the refresh duration signal and an oscillation signal;
   a period signal generator configured to generate a refresh period signal using the oscillation signal generated in response to the refresh duration correction signal;
   an refresh address counter configured to count and output a refresh address in response to the refresh period signal; and
   a memory cell block configured to refresh memory cells corresponding to the refresh address.

8. The semiconductor integrated circuit of claim 7, wherein the signal controller comprises:
   a refresh beginning detector configured to detect a start point of an active time of the refresh duration correction signal in response to an activation of the refresh duration signal;
   a refresh end detector configured to detect an end point of an active time of the refresh duration correction signal in response to a combination of the refresh duration signal and the oscillation signal; and
   a latch configured to activate and latch the refresh duration correction signal in response to an output of the refresh beginning detector and configured to inactivate the refresh duration correction signal in response to an output of the refresh end detector.

9. The semiconductor integrated circuit of claim 8, wherein the refresh beginning detector comprises:
   a pulse generator configured to output a pulse response to the refresh duration signal; and
   a switching device configured to connect a power source voltage to an input of the latch in response to the pulse response.

10. The semiconductor integrated circuit of claim 8, wherein the refresh end detector is configured to initialize the refresh duration correction signal in response to a power-up signal.

11. The semiconductor integrated circuit of claim 7, wherein the period signal generator comprises:
    an oscillator configured to generate the oscillation signal in response to the refresh duration correction signal; and
    a pulse generation unit configured to generate the refresh period signal in response to the oscillation signal.

12. The semiconductor integrated circuit of claim 11, further comprising a frequency divider configured to divide the oscillation signal and provide a plurality of frequency signals into the pulse generation unit.

* * * * *